United States Patent
Roscoe et al.

(10) Patent No.: US 6,760,229 B2
(45) Date of Patent: Jul. 6, 2004

(54) SYSTEM FOR PROTECTING ELECTRONIC COMPONENTS

(75) Inventors: Brett D. Roscoe, Tomball, TX (US); George D. Megason, Spring, TX (US); Christian H. Post, Spring, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/237,420

(22) Filed: Sep. 9, 2002

(65) Prior Publication Data

US 2003/0007335 A1 Jan. 9, 2003

Related U.S. Application Data

(63) Continuation-in-part of application No. 09/691,507, filed on Oct. 18, 2000, now Pat. No. 6,498,731.

(51) Int. Cl.[7] .................................................. H05K 5/06
(52) U.S. Cl. ................ 361/752; 361/797; 361/686; 361/756; 361/802; 257/99; 439/377
(58) Field of Search ............................. 361/752, 724, 361/714, 816, 797, 800, 756, 729, 741, 802, 686; 257/99; 439/377

(56) References Cited

U.S. PATENT DOCUMENTS

| | | | |
|---|---|---|---|
| 4,602,351 A | | 7/1986 | Shimamura et al. |
| 5,214,572 A | * | 5/1993 | Cosimano et al. .......... 361/802 |
| 6,052,278 A | | 4/2000 | Tanzer et al. |
| 6,078,504 A | * | 6/2000 | Miles ......................... 361/727 |
| 6,241,545 B1 | | 6/2001 | Bricaud et al. |
| 6,270,369 B1 | * | 8/2001 | Kato et al. .................. 439/326 |
| 6,272,017 B1 | | 8/2001 | Klatt et al. |
| 6,292,361 B1 | * | 9/2001 | Johnson et al. ............. 361/687 |
| 6,317,334 B1 | * | 11/2001 | Abruzzini et al. .......... 361/797 |

\* cited by examiner

*Primary Examiner*—David Martin
*Assistant Examiner*—Hung Bui

(57) ABSTRACT

A system having a removable protective enclosure for an electronic component. The protective enclosure may have a base and a circuit board that may be captured by the base without use of a tool or a separate fastener. A memory module may be disposed on the circuit board. The protective enclosure may be adapted to be mechanically and electrically coupleable to an enclosure.

29 Claims, 8 Drawing Sheets

SYSTEM FOR PROTECTING ELECTRONIC COMPONENTS

This application is a continuation-in-part of patent application Ser. No. 09/691,507, filed on Oct. 18, 2000 now U.S. Pat. No. 6,498,731.

FIELD OF THE INVENTION

The present invention relates generally to a system for protecting electronic components, and particularly to a system for protecting electronic components disposed on printed circuit boards.

BACKGROUND OF THE INVENTION

Typically, electronic components are installed on printed circuit boards for use in a variety of electrical devices. Electronic components often are built with metal conductive leads to electrically couple the component to the printed circuit board. Typically, the electronic component is placed on a surface of the printed circuit board and the metal leads are soldered to thin layers of copper, called traces, on the printed circuit board. The traces form conductive paths that allow electricity to flow through the printed circuit board.

Soldering serves two purposes. First, soldering helps physically secure the electronic component to the printed circuit board, and second, soldering ensures a good electrical connection between the electronic component and the traces. As an alternative to soldering, electronic components, such as computer chips and memory modules, are inserted into sockets predisposed on the printed circuit board. When the electronic component is inserted into the socket, the leads of the component are electrically coupled by the socket to the traces in the printed circuit board. Typically, a printed circuit board also contains an electrical connector to electrically couple the printed circuit board to another electrical device.

The nature of the electrical components/printed circuit board connections makes the assembled printed circuit boards especially susceptible to damage from mishandling. Dropping a printed circuit board to the floor can effectively ruin the board and any components mounted to it. Damage can occur not only to the electronic components but also to the solder bonds between electronic components and the printed circuit board. Furthermore, computer chips and memory modules can be dislodged from their sockets. Such damaged or dislodged electronic components can be extremely difficult to spot visually. Thus, if a board is dropped during assembly the damage may go undetected until operation of the device is attempted.

Mishandling also can occur when replacing or upgrading electronic components. For example, memory modules are one of the more commonly upgraded features of a computer. Purchasing additional memory modules in order to increase a computer systems memory is fairly common. Furthermore, most computer manufacturers build an upgrade capability into their systems. For example, computer manufacturers routinely install extra sockets on the printed circuit boards so that additional memory elements can be added at a later date. Alternatively, extra slots are reserved in an electrical device so that additional printed circuit boards containing memory modules can be added. Typically, however, in order to upgrade a computer's memory, or repair a damaged memory module an operator must access the interior of the computer, thus exposing the operator to a potential electric shock.

Therefore, it would be advantageous to have a system that could allow electronic components to be removed from an electrical device while protecting electrical components from mishandling and minimizing the potential for electric shock.

In addition, many circuit boards are secured within an electronic device by removable fasteners, such as screws. Thus, an inventory of removable fasteners must be maintained during assembly of an electronic device. In addition, the fasteners must be removed and retained whenever the board is removed. In addition, a tool, such as a screwdriver typically is used to install and/or remove fasteners. In such cases, a tool must be provided to enable the board to be secured or removed from the electronic device. All of these factors increase the time and expense of assembly and disassembly of an electronic device. Therefore, a need exists for a system or method to enable a circuit board to be secured to an electronic device without a removable fastener and without use of a tool.

SUMMARY OF THE INVENTION

A protective assembly for an electronic component is featured. The electronic component may be disposed on a printed circuit board. The protective assembly may be adapted to prevent the electronic component from contacting a planar surface, such as a table top or the floor, when the assembly is disposed against the planar surface. The printed circuit board may be secured to the protective assembly without use of a tool or a removable fastener.

According to another aspect of the present invention, a method for assembling an electronic device is featured. The method may comprise disposing an electronic component, such as a memory module, on a printed circuit board and placing the printed circuit board within a protective assembly. The printed circuit board may be secured to the protective assembly by disposing the printed circuit board relative to the protective assembly. The printed circuit board may be secured to the protective assembly without use of tools or without a removable fastener.

BRIEF DESCRIPTION OF THE DRAWINGS

The invention will hereafter be described with reference to the accompanying drawings, wherein like reference numerals denote like elements, and.

DETAILED DESCRIPTION OF THE PREFERRED EMBODIMENTS

Figure 1:
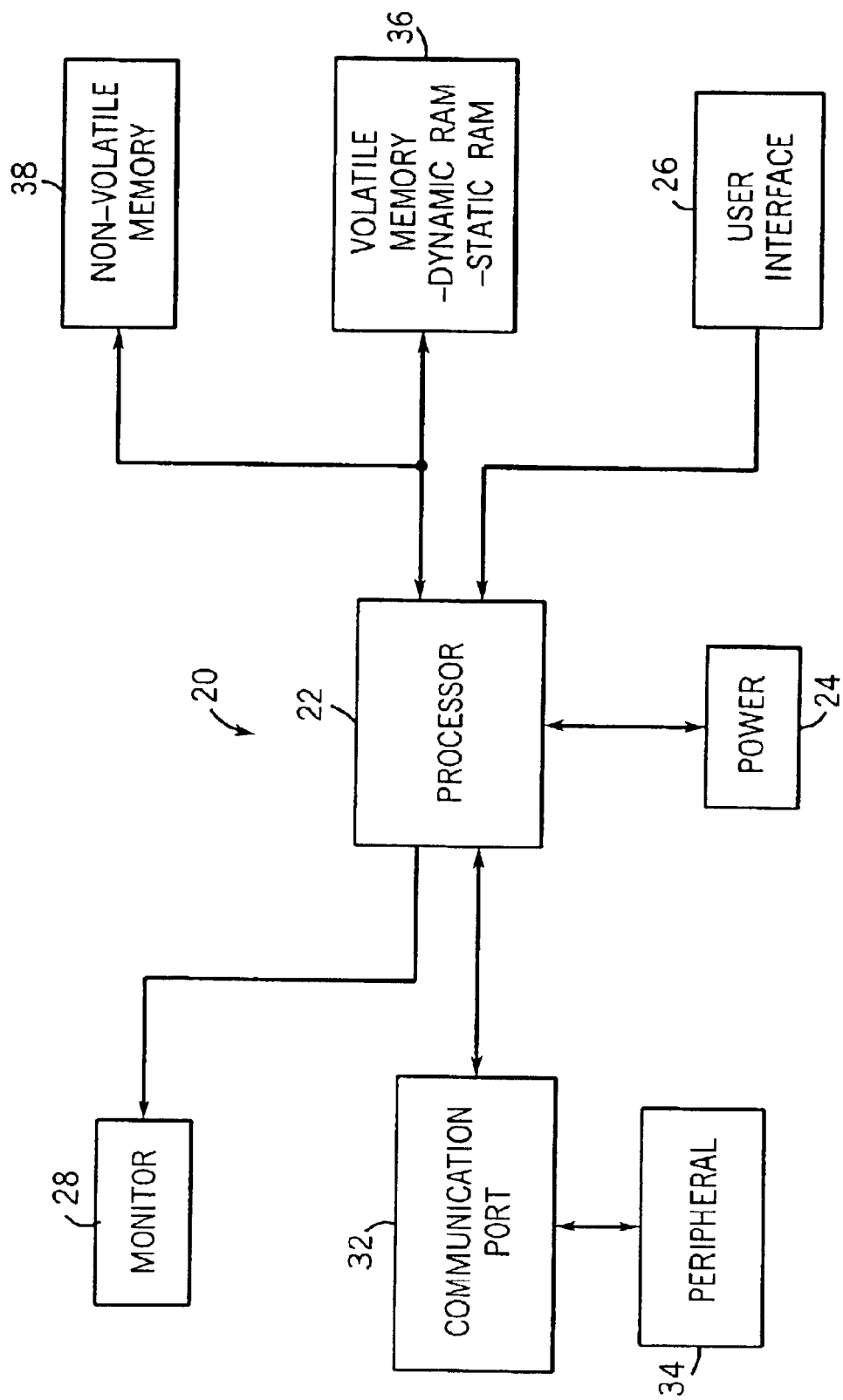
FIG. 1 is a block diagram of an electronic device.
Figure 3:
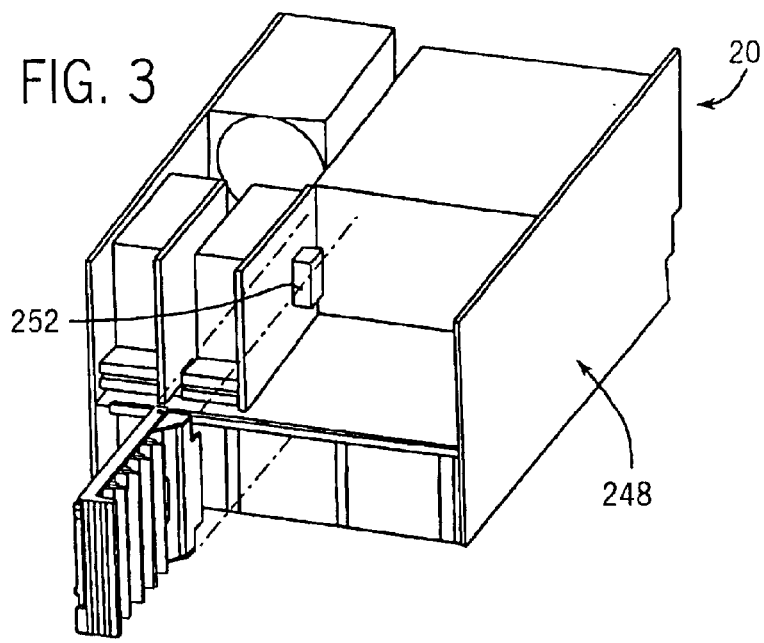
FIG. 3 is a front perspective view of an electronic device and protective assembly, according to a preferred embodiment of the present invention.

Referring generally to FIG. 1, a block diagram is illustrated depicting an exemplary electronic device, generally designated by the reference numeral 20. Electronic device 20 may be any of a variety of different types, such as a server, a personal organizer, a notebook computer, a personal computer, a workstation, an Internet server, a minicomputer, etc. In a typical electronic device, a processor controls many of the functions of the device. In the illustrated embodiment, processor 22 controls the functions of electronic device 20. An exemplary electronic device 20 also is illustrated in FIG. 3 and discussed below.

Electronic device 20 typically includes a power supply 24. If device 20 is portable, power supply 24 includes permanent batteries, replaceable batteries, and/or rechargeable batteries. Power supply 24 may also include an A/C adapter, so that the device may be plugged into a wall outlet, for instance. In fact, power supply 24 may also include a D/C adapter, so that device 20 may be plugged into the D/C voltage of a vehicle.

Various other devices may be coupled to processor 22, depending upon the functions that device 20 performs. For example, a user interface 26 may be coupled to processor 22. Examples of user interfaces 26 include buttons, switches, a keyboard, a light pen, a mouse, and/or a voice recognition system. A display 28 may also be coupled to processor 22. Examples of displays 28 include: a television screen, a computer monitor, LEDs, or even an audio display. A communications port 32 may also be coupled to processor 22. Communications port 32 may be adapted to be coupled to a peripheral device 34, such as a printer, a computer or an external modem.

Typically, processor 22 utilizes programming to control the function of device 20. Memory is coupled to processor 22 to store and facilitate execution of the programming. For example, processor 22 may be coupled to a volatile memory 36 and a non-volatile memory 38. Non-volatile memory 38 may include a read only memory (ROM), such as an EPROM, to be used in conjunction with volatile memory 36. The size of the ROM is typically selected to be just large enough to store any necessary operating system, application programs, and fixed data. Volatile memory 36, on the other hand, is typically quite large so that it can store dynamically loaded applications. Additionally, non-volatile memory 38 may include a high capacity memory such as a disk or tape drive memory.

A variety of memory modules, such as DIMMs, DRAMs, SDRAMs, SRAMs, etc. can be utilized for a given device or application. The present protective assembly, discussed below, is particularly amenable to protecting electric components such as memory modules that are utilized in, for example, a server.

Figure 2:
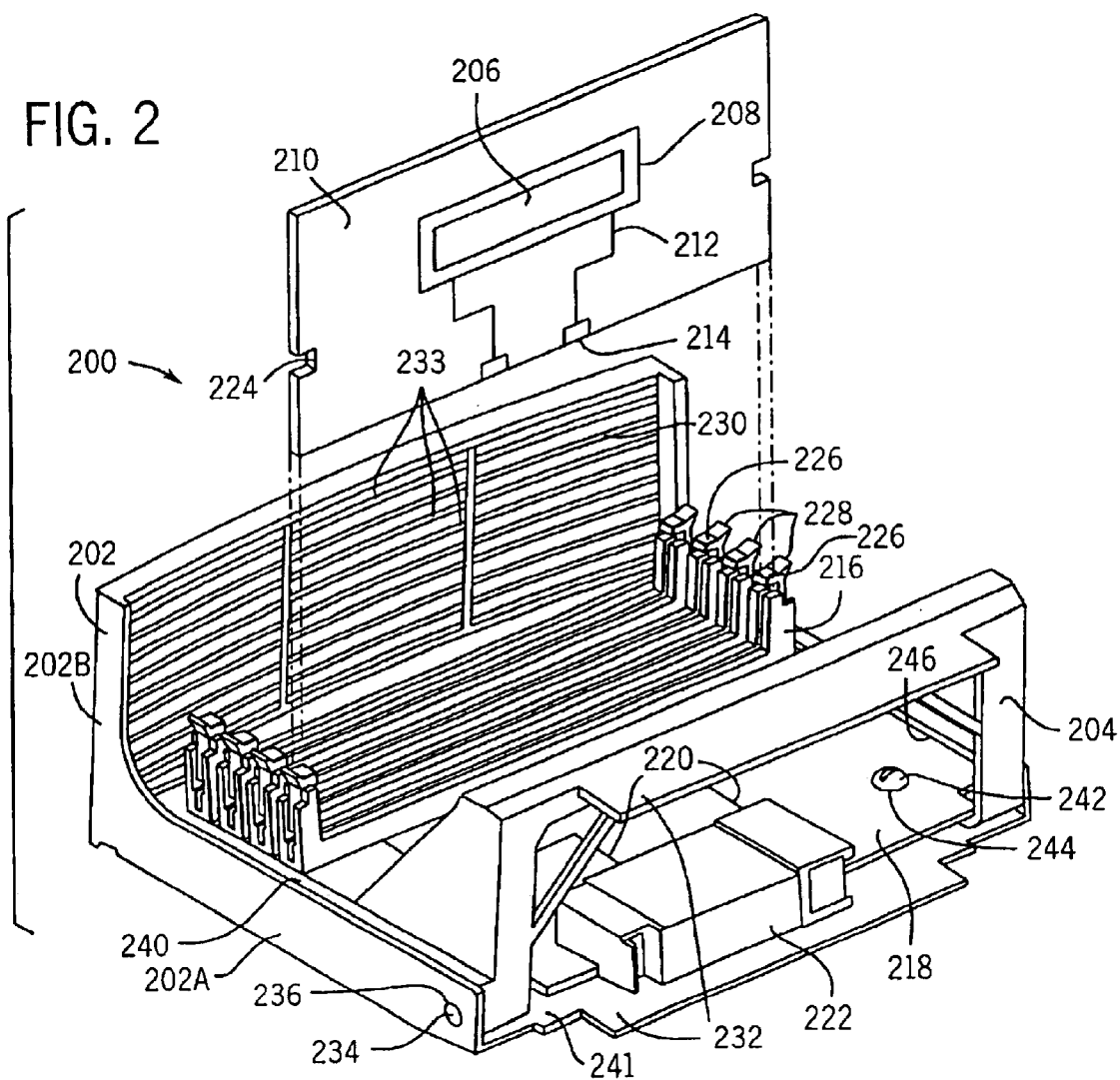
FIG. 2, is a perspective view of a protective assembly, according to a preferred embodiment of the present invention.

Referring generally to FIG. 2, a protective assembly or cartridge 200 is shown according to an exemplary embodiment of the present invention. Protective assembly 200 includes a base 202 and a rollbar 204. Base 202 and rollbar 204 protect electronic components disposed within protective assembly 200 from damage due to mishandling. Base 202 includes a primary base region 202A and a secondary base region 202B that extends generally transversely, e.g. perpendicularly, from primary base region 202A. Rollbar 204 also extends generally transversely from primary base region 202A in the same general direction as secondary base region 202B. Effectively, secondary base region 202B acts as a second rollbar spaced from rollbar 204.

In the illustrated embodiment, an electronic component 206, e.g. a memory module, is mounted in a socket 208. Socket 208 is, in turn, mounted on printed circuit board 210, hereinafter referred to as a "daughterboard". Conductive traces 212 on daughterboard 210 electrically couple memory module 206 to conductive strips 214 along an edge of daughterboard 210. Daughterboard 210 is installable into electrical connector 216. Electrical connector 216 is mounted on a second printed circuit board 218, hereinafter referred to as a "motherboard."

Motherboard 218 serves to secure daughterboard 210 into protective assembly 200 and to electrically couple daughterboard 210 to device 20. Electrical connectors 216 contain conductive elements that contact conductive strips 214. Motherboard 218 also has conductive traces 220 that electrically couple electrical connector 216 to a multi-pin connector 222. Multi-pin connector 222 is, in turn, electrically coupleable to a respective multi-pin connector disposed within the electronic device. Thus, when the multi-pin connectors are joined, a conductive path from memory module 206 through protective assembly 200 to electronic device 20 is completed.

In the illustrated embodiment, electrical connector 216 also mechanically secures daughterboard 210 to motherboard 218. Daughterboard 210 may be manufactured with small notches 224 on the sides. Clips 226 of electrical connector 216 fit into the notches, holding daughterboard 210 securely within electrical connector 216. Each clip 226 has a thumb release 228 that, when operated, pulls the clip from the corresponding notch 224, allowing the subject daughterboard to be removed from the electrical connector 216.

In the illustrated embodiment, secondary base region 202B includes a grill 230 disposed at a predetermined distance from rollbar 204 to protect the memory modules 206. Grill 230 and rollbar 204 extend from the base 202 and above or beyond the electrical components 206 located on daughterboard 210. Thus, if protective assembly 200 inadvertently strikes an object, such as the floor or a desktop, either base 202 or rollbar 204 tends to absorb the impact rather than daughterboard 210 or memory module 206. Additionally, base 202 and rollbar 204 are constructed with tabs 232 to protect multi-pin connector 222. Thus, multi-pin connector 222 will not strike the ground first if protective assembly 200 is dropped. It should be noted that grill 230 may be constructed with ventilation holes 233 to allow air to cool memory module 206 or the grill may be removed altogether, depending on the application.

In the exemplary embodiment, rollbar 204 is attached to base 202 with a pin-and-socket system. Rollbar 204 includes a pair of outwardly extending pins 234, while base 202 includes a pair of corresponding sockets, or apertures 236. Pins 234 are pivotably disposed in sockets 236, allowing the rollbar 204 to pivot during the assembly process, as illustrated in FIGS. 4–7.

As further illustrated in FIGS. 4–7, motherboard 218 is secured to protective assembly 200 by a lip 238 extending from the base of grill 230. The motherboard 218 is further secured by a pair of base side walls 240 extending generally perpendicular to both motherboard 218 and a support wall 241 of base 202 that connects side walls 240. Motherboard 218 also is secured by one or more fasteners, such as a pair of screws 242 inserted through two corresponding holes 244 in motherboard 218. Lip 238 and screws 242 prevent movement of motherboard 218 in one axial direction, while the side walls 240 of base 202 prevent lateral movement. A pair of board guides 246 in rollbar 204 are sized to slidably receive and further support motherboard 218.

Referring again to FIG. 3, an electronic device 20 is shown, according to a preferred embodiment of the present invention. In the exemplary embodiment shown, the electronic device comprises a server having a chassis 248. Chassis 248 is designed to receive protective assembly 200 and to protect an electronic component, e.g. memory modules. Protective assembly 200 is removable from electronic device chassis 248 and allows electronic components to be easily accessed, without the need for tools and without the need to disassemble chassis 248.

Once removed from the device, new electronic components, such as memory modules, can be added to protective assembly 200 to upgrade or replace the device's electronic components. The exemplary device 20 includes multi-pin connector 252 configured to mate with multi-pin connector 222 of protective assembly 200. Preferably, chassis 248 and protective assembly 200 are configured so that the multi-pin connectors are properly aligned and mated when protective assembly 200 is inserted into chassis 248.

Figure 4:
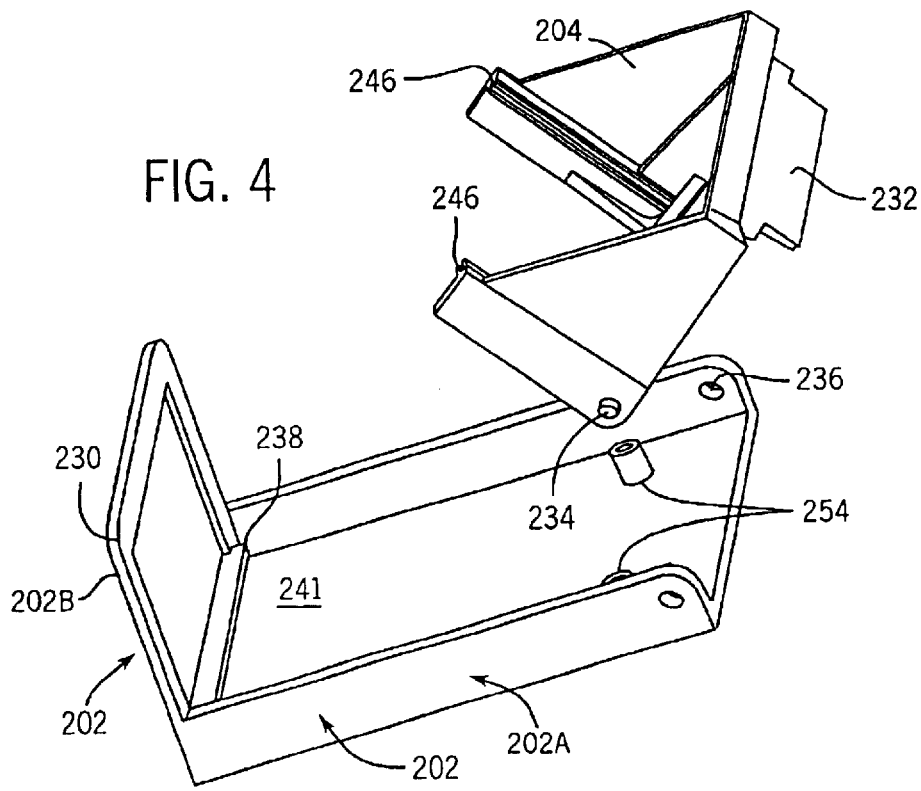
FIG. 4 is an exploded view illustrating the assembly of a rollbar to a protective assembly base, according to a preferred embodiment of the present invention.

Interaction of the various components of protective assembly 200 can be better understood with reference to FIGS. 4–8. Referring generally to FIG. 4, rollbar 204 initially is pivotably secured to base 202 by, for example, receipt of two pins 234 in corresponding sockets 236. Rollbar 204 is manufactured from a material, such as plastic, that requires a relatively small force to compress the rollbar 204 so that pins 234 can be inserted in the sockets 236. The pin-and-socket arrangement allows the pins 234 to rotate within the sockets 248, thus allowing the rollbar 204 to pivot. Screws 242 are threaded into corresponding sockets 254 disposed on support wall 241 of base 202.

Figure 5:
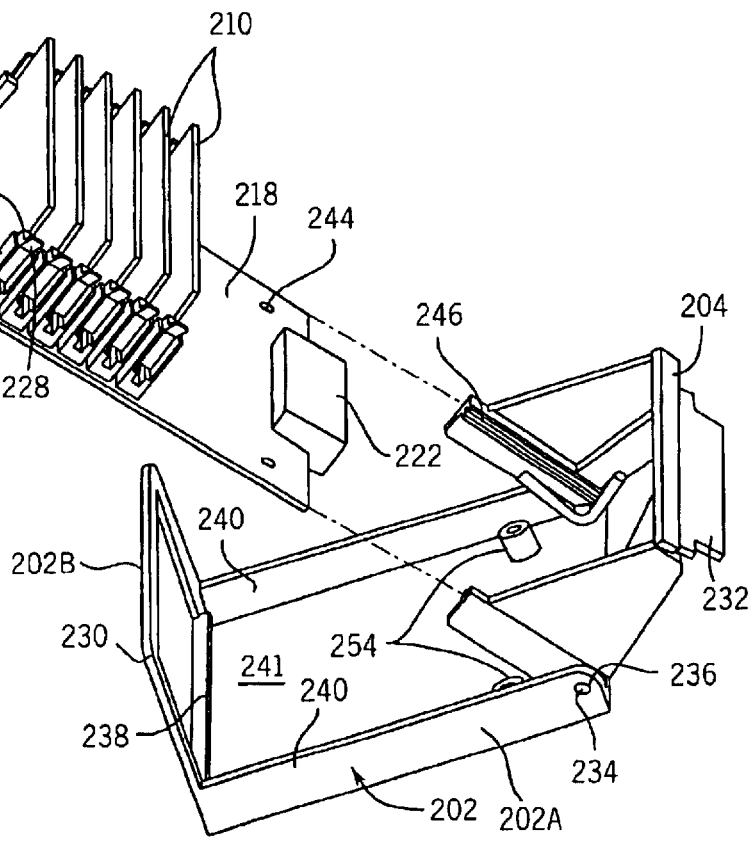
FIG. 5 is an exploded view similar to that of FIG. 4 and illustrating the insertion of printed circuit board into the protective assembly.
Figure 6:
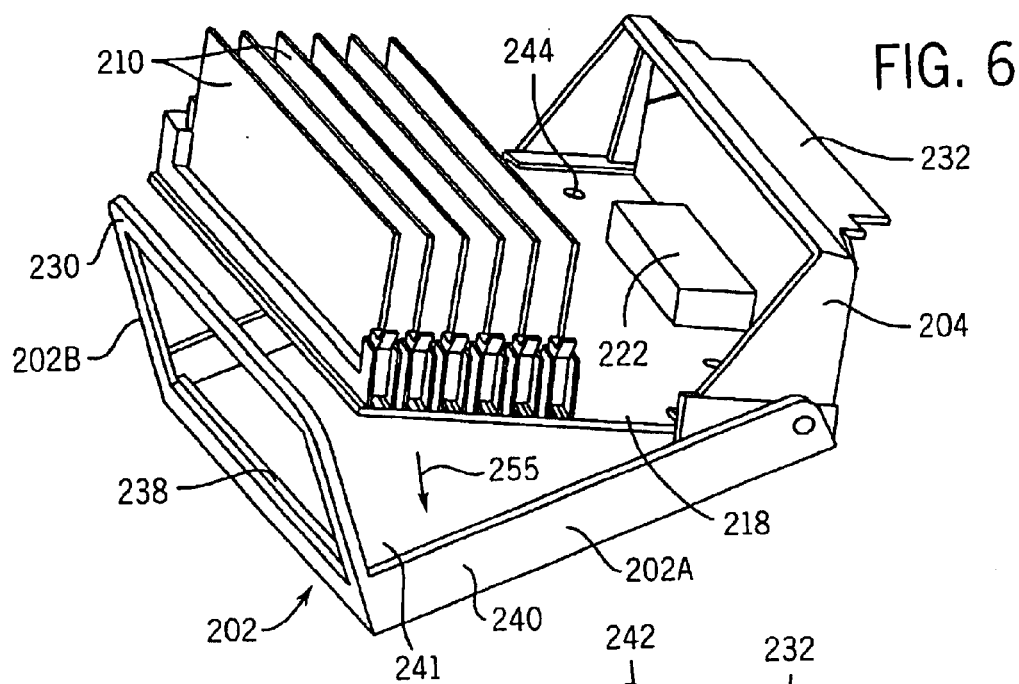
FIG. 6 is a perspective view of the protective assembly and printed circuit board illustrated in FIG. 5.

Referring generally to FIG. 5, the rollbar 204 also serves to facilitate the installation of motherboard 218 and a plurality of daughterboards 210 into the protective assembly 200. After connecting rollbar 204 to base 202, rollbar 204 is pivoted clockwise to permit insertion of motherboard 218 into board guides 246. The daughterboards 210 may be inserted prior to insertion of motherboard 218 into guides 246 or at a later stage. After receiving motherboard 218 in board guides 246, rollbar 204 and motherboard 218 are pivoted counterclockwise, along arrow 255 of FIG. 6, to place motherboard 218 against base 202.

Figure 7:
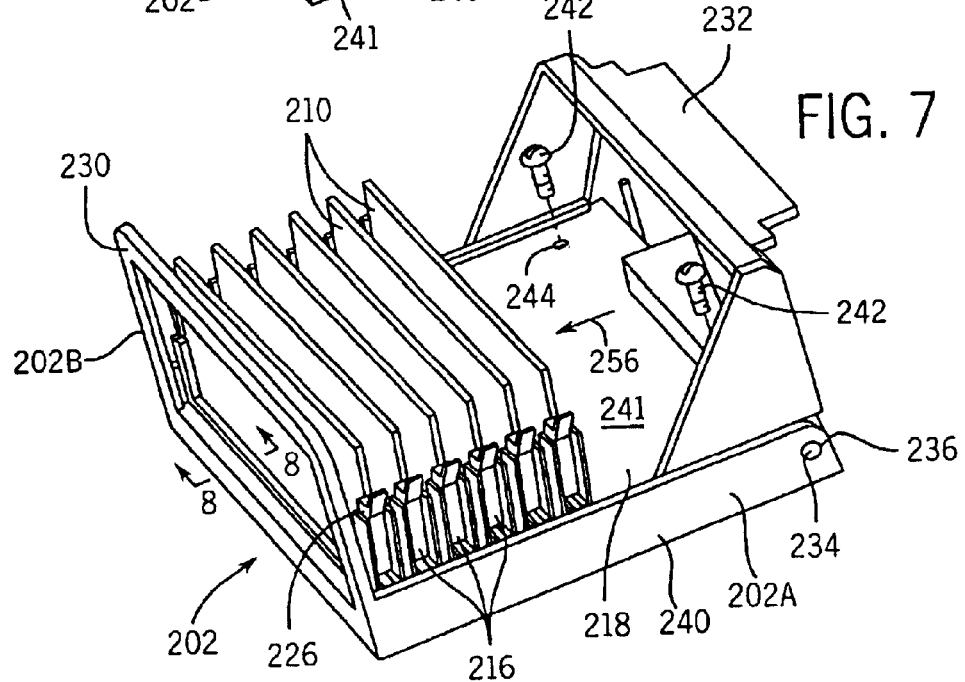
FIG. 7 is a perspective view of the protective assembly and printed circuit board illustrated in FIG. 5.
Figure 8:
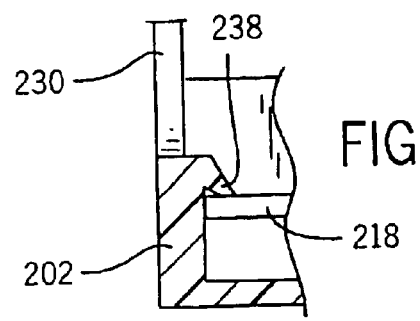
FIG. 8 is a cross-sectional view taken generally along line 8—8 of FIG. 7 illustrating a lip on the base for holding the printed circuit board.

Referring generally to FIG. 7, once motherboard 218 is placed against base 202, motherboard 218 is moved towards secondary base region 202B along arrow 256. Lip 238, as best illustrated in FIG. 8, holds the edge of motherboard 218 adjacent grill 232 against base 202. Two screws 242 threaded into sockets 254 further secure motherboard 218 to base 202. If not added previously, daughterboards 210 may be disposed within the electrical connectors 216 on motherboard 218 at this time. The protective assembly is now ready for insertion into electronic device 20.

Figure 9:
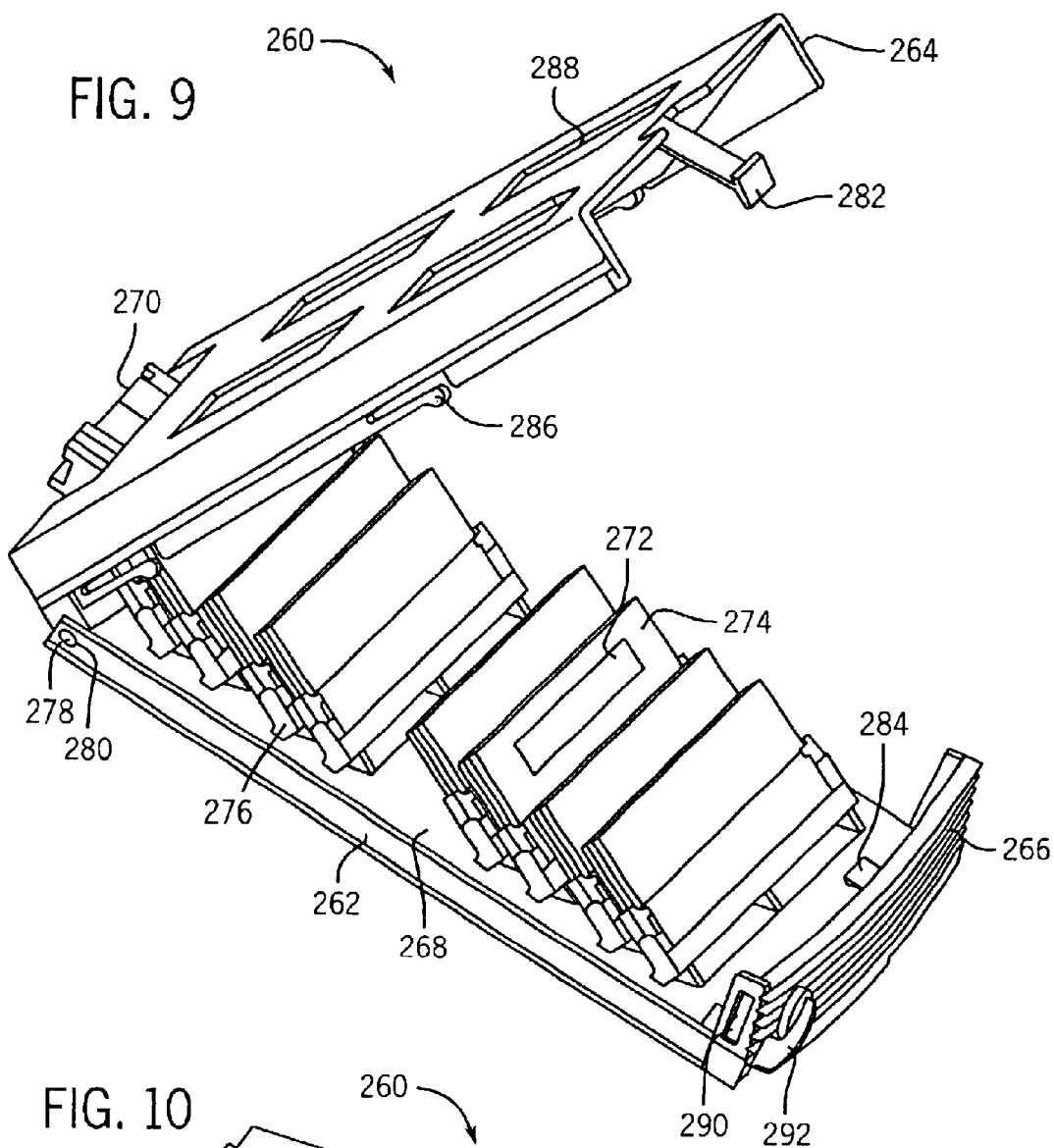
FIG. 9 is a perspective view of an alternative embodiment of a protective assembly with its cover open.

Referring generally to FIG. 9, an alternative embodiment is shown for a protective assembly for electronic components. A protective assembly 260 includes a base 262 and a cover 264. In this embodiment, cover 264 also provides protection to the electronic component from sharp objects and non-planar surfaces, such as the edge of a table.

Base 262 has a front protective wall 266 that may be in the form of a grill. A motherboard 268, including an electrical connector 270, is disposed onto base 262. Electronic components 272, such as memory modules, are disposed onto a daughterboard 274. Daughterboard 274 may be disposed in an angled board holder 276. The angled board holder 276 allows protective assembly 260 to have a lower overall profile by securing daughterboards 274 at an angle, rather than upright.

Figure 10:
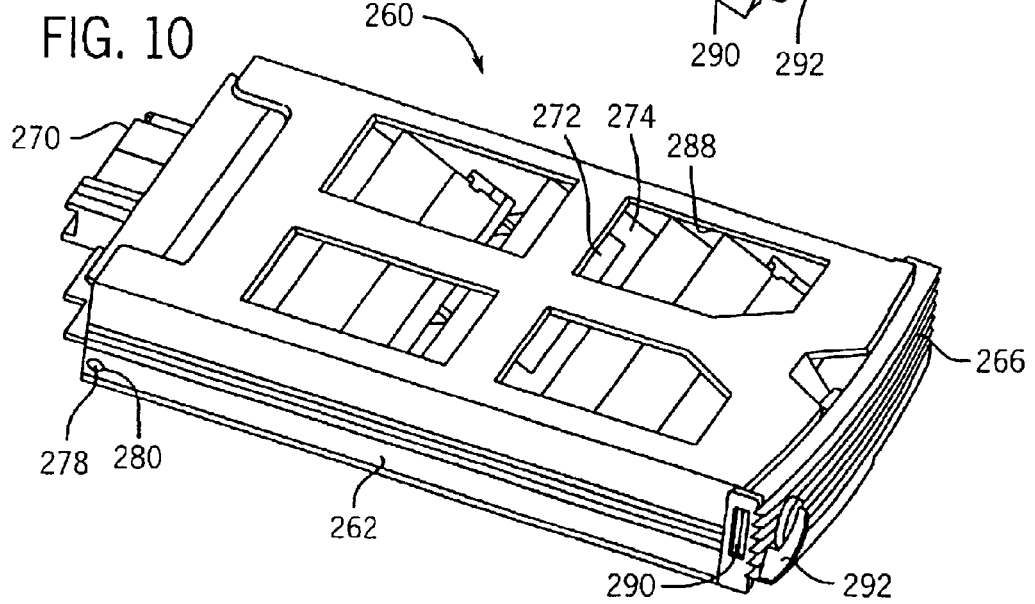
FIG. 10 is a perspective view of the alternative embodiment illustrated in FIG. 9, but with the cover closed.

Cover 264 is secured to base 262 with a pin-and-socket system. In the illustrated embodiment, cover 264 has two pins 278, which fit into two sockets 280 in base 262. Pins 278 are free to rotate within the sockets 280, allowing cover 264 to pivot. Cover 264 also has a latch 282 which can be used to secure the cover to a catch 284 on grill 266. A spring element 286 on cover 264 is compressed against base 262 when cover 264 is latched, as shown in FIG. 10. When latch 282 is removed from catch 284 the energy stored in spring element 286 acts to spring open the cover 264. Ventilation holes 288 in cover 264 allow air to flow over and cool electronic components 272.

As illustrated, the protective assembly includes a latch mechanism to secure protective assembly 260 within an electronic device. The latch mechanism includes a latch 290 and an operator 292. As operator 292 is turned it causes latch 290 to rotate, engaging the latch 290 against a respective catch in the electronic device. Operator 292 is rotated to disengage latch 290 in order to remove protective assembly 260 from the device. When cover 264 is closed, the protective cartridge is ready for installation into an electronic device.

Figure 11:
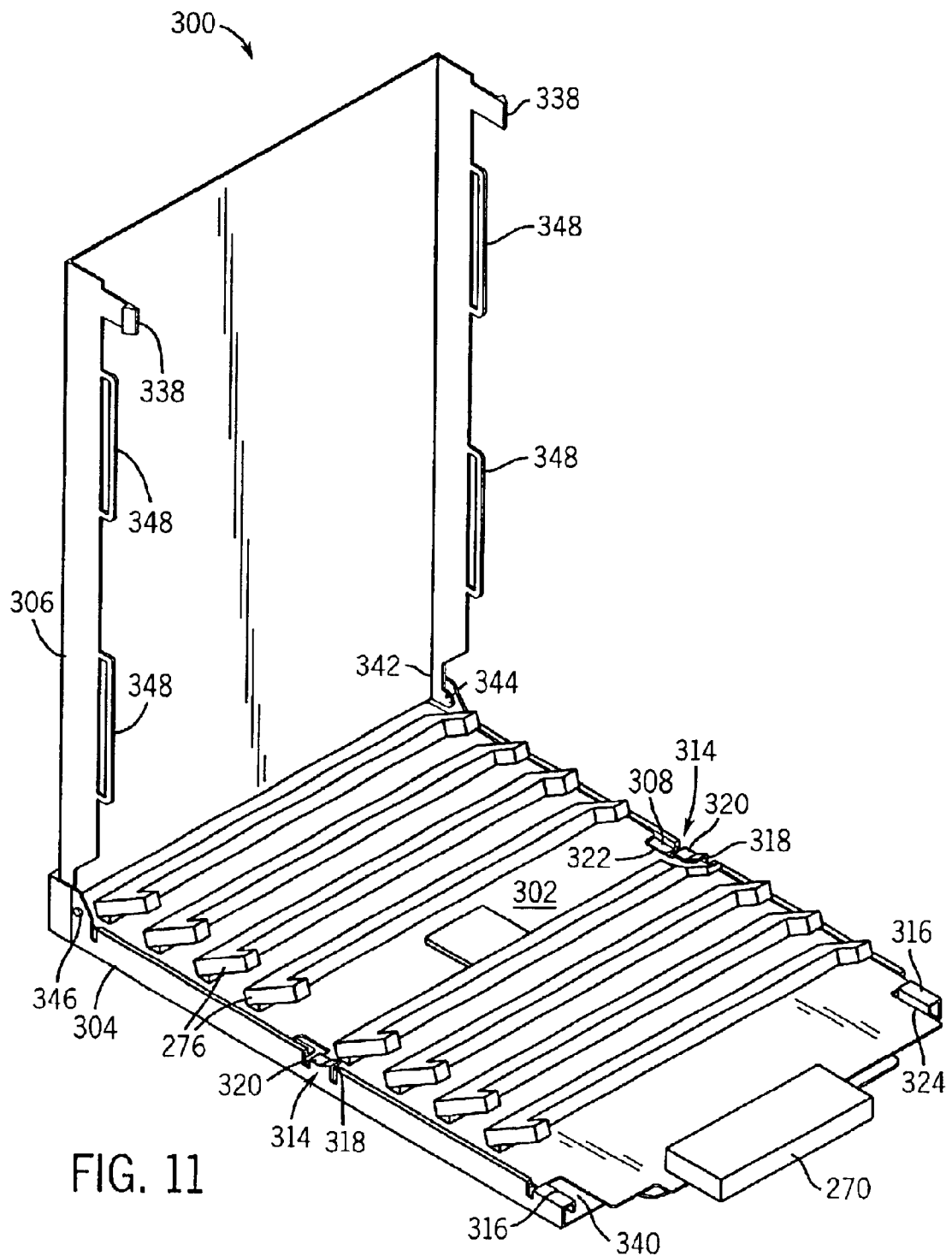
FIG. 11 is a perspective view of a second alternative embodiment of a protective cartridge, according to an exemplary embodiment of the present invention.

Referring generally to FIG. 11, an additional alternative embodiment of a protective cartridge 300 is illustrated. In this embodiment, a plurality of daughterboards 274 are disposed in angled board holders 276 disposed on an alternative embodiment of a second printed circuit board, or motherboard, 302. In the illustrated embodiment, the protective cartridge 300 and motherboard 302 are adapted to cooperate to secure the motherboard 302 to the protective cartridge 300 without the use of tools or any additional parts.

Figure 12:
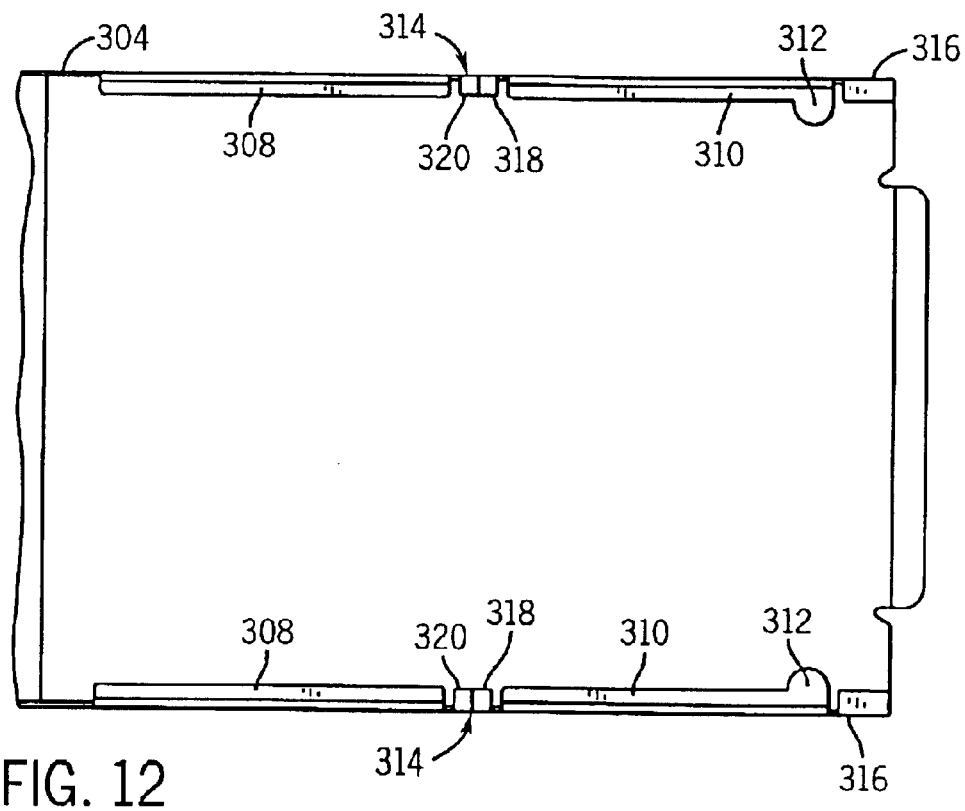
FIG. 12 is a top view of a base portion of a protective cartridge, according to an exemplary embodiment of the present invention.
Figure 13:
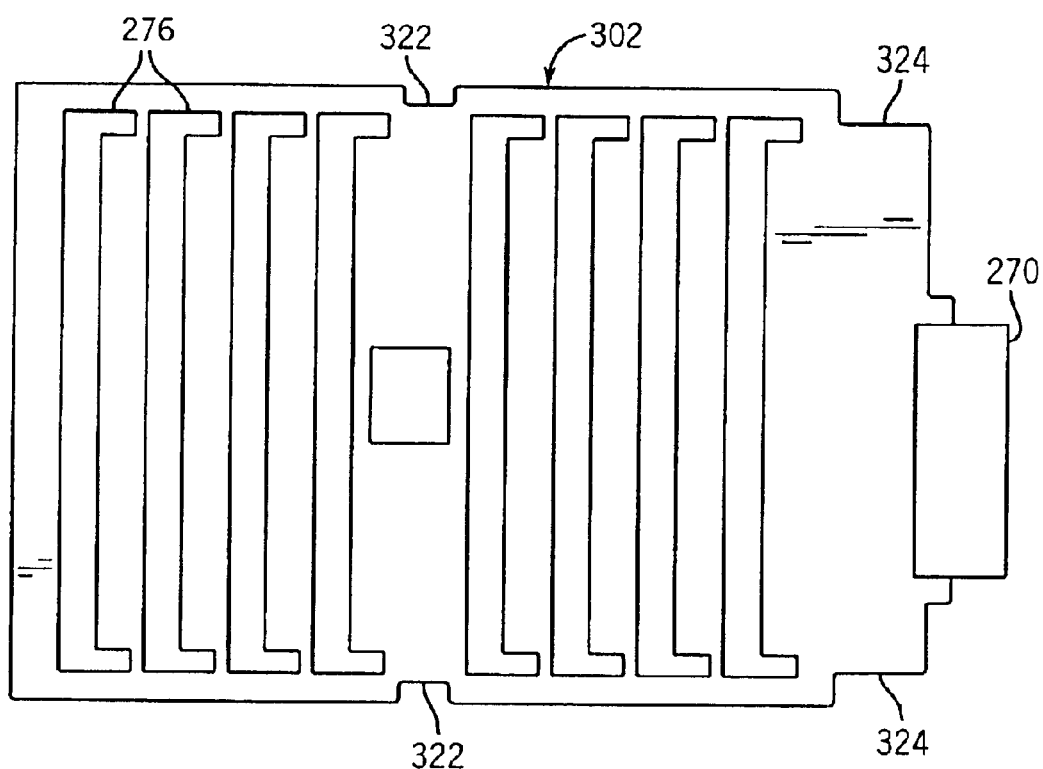
FIG. 13 is a top view of a printed circuit board adapted for disposal within the base portion of FIG. 12, according to an exemplary embodiment of the present invention.

Referring generally to FIGS. 11–13, the protective cartridge 300 has a base portion 304 and a cover portion 306. As best illustrated in FIG. 12, the base portion 304 has a first guide rail 308 and a second guide rail 310 on each side. The first and second guide rails are adapted to support the motherboard 302. In this embodiment, the second guide rail 310 has been adapted with a protrusion 312 to provide additional support to the end of the motherboard 302. The base portion 304 has been adapted with a first tab 314 and a second tab 316 on each side. The first and second tabs are adapted to extend inward from each side of the protective cartridge 300. The guide rails 308 and 310, the first tabs 314, the second tabs 316, and the lip 238 (not shown in this view) are adapted to cooperate with the motherboard 302 to restrict movement of the motherboard 302 relative to the base 304.

The first tab 314 has a board guide portion 318 and a board securing portion 320. The board guide portion 318 is adapted to guide the motherboard 302 toward the board securing portion 320. The board securing portion 320 is adapted to prevent the motherboard 302 from being lifted upward from the base 304, in this embodiment.

As illustrated in FIG. 13, each side of the motherboard 302 is adapted with a first notch 322 and a second notch 324. Each first notch 322 is adapted to fit around a corresponding first tab 314 to enable the motherboard 302 to be disposed on the guide rail 308. Each of the second notches 324 is adapted to support an end of the motherboard 302 during installation of the motherboard 302 and to obstruct movement of the motherboard 302 when the motherboard 302 is installed in the base 304.

Figure 14:
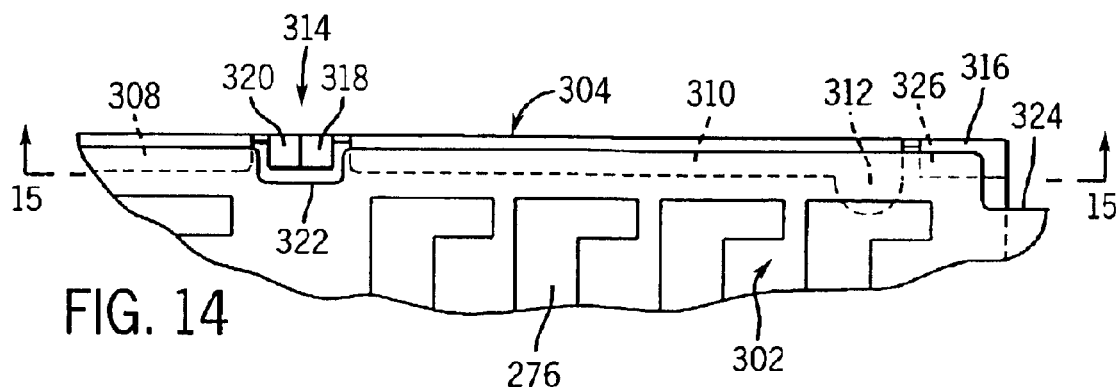
FIG. 14 is a top view illustrating the installation of the printed circuit board of FIG. 13 into the base portion of FIG. 12.
Figure 15:
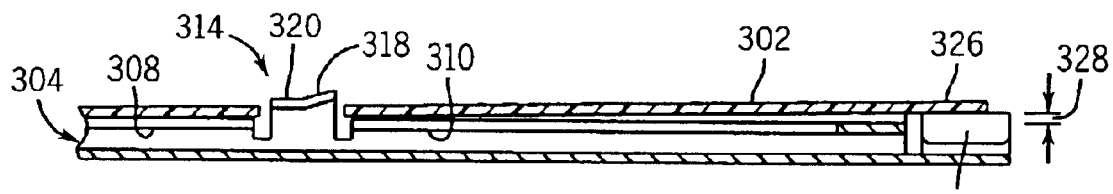
FIG. 15 is a side view illustrating the installation of the printed circuit board of FIG. 13 into the base portion of FIG. 12.

As illustrated in FIGS. 14 and 15, to install the motherboard 302 to the base 304, the first notch 320 of the motherboard 302 is aligned with the first tab 310 to align the motherboard 302 with the base 304. The rear edge portion 326 of the motherboard 302 is supported by the second tab 316. In the illustrated embodiment, the second tab 316 is disposed at a different height than the guide rails 308 and 310, as represented by reference numeral 328, thereby disposing the motherboard 302 at an angle, typically a slight angle.

Figure 16:
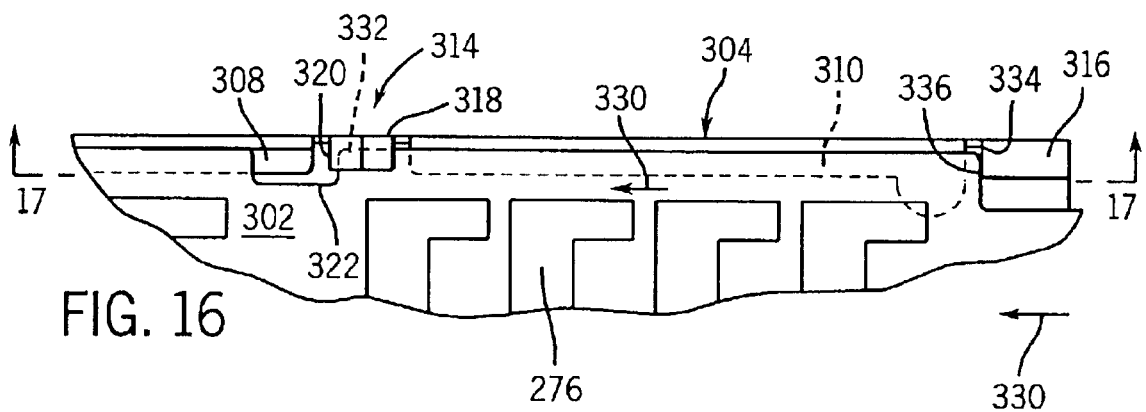
FIG. 16 is a top view illustrating the securing of the printed circuit board of FIG. 13 into the base portion of FIG. 12.
Figure 17:
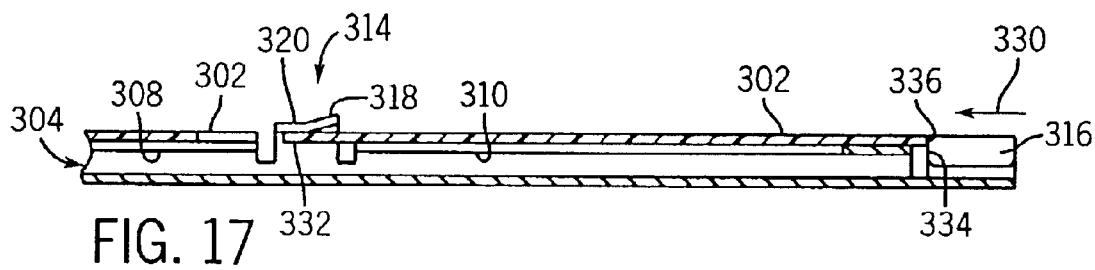
FIG. 17 is a side view illustrating the securing of the printed circuit board of FIG. 13 into the base portion of FIG. 12.

Referring generally to FIGS. 16 and 17, the motherboard 302 is secured to the base 304 by aligning the motherboard 302 with the base 304 and moving the motherboard 302 laterally, relative to the base 304, to enable the base 304 to capture the motherboard 302. In this embodiment, as the motherboard 302 is moved laterally toward the front of the assembly 300, as represented by the arrow 330, an edge portion 332 of the motherboard 302, adjacent to the first notch 322, is guided by the guide portion 318 of the first tab 314 towards the securing portion 320 of the first tab 314.

In this embodiment, the motherboard 302 is flexed by the first tab 314 and the second tab 316 as the motherboard 302 is moved laterally toward a secured position in the base 304. Either the guide portion 318 and securing portion 320, or both, of the first tab 314 may cooperate with the second tab 316 to bend the motherboard 302.

Typically, the motherboard 302 is comprised of an elastic material. As the motherboard 302 is flexed, the motherboard 302 produces a biasing force to urge the motherboard 302 back towards its unbent shape. As the lateral movement of the motherboard 302 continues, the second tab 316 no longer supports the rear edge portion 326 of the motherboard 302. The biasing force produced in the motherboard 302 also tends to urge the motherboard 302 toward the second guide rail 310 and the protrusion 312 once the rear edge portion 326 of the motherboard 302 is clear of the second tab 316.

The first tabs 314 located on each side of the motherboard 302 prevent vertical movement of the motherboard 302. Simultaneously, the sides of the base, the second tabs 316 located on each side of the motherboard 302, and the lip 238 (not shown) prevent lateral movement of the motherboard. Rearward lateral movement of the motherboard 302 is prevented by contact between a side 334 of the second tab 316 and the rear edge 336 of the motherboard 302.

To remove the motherboard 302, the rear of the motherboard is flexed to raise the rear edge 336 of the motherboard 302 above the second tabs 316. The motherboard 302 may then be moved laterally relative to the base 304 to align the first notches 322 with the first tabs 314. The motherboard 302 may be lifted from the base 302 with the first notches 322 aligned with the first tabs 314.

Referring again to FIG. 11, the cover 306 and motherboard 302 are adapted to secure the cover to the base 304. The cover is comprised of a flexible material, such as a polymer. The cover 306 has a pair of clips 338 that are adapted to catch the underside of the second tabs 316 to secure the cover 306 to the base 304 when the cover 306 is pivoted toward the base 304. The second notches 324 on the motherboard 302 are adapted to form a gap 340 between each second tab 316 and the motherboard 302 to enable the clips 338 to be disposed between the second tabs 316 and the motherboard 302. The clips 338 are depressed to open the cover 306.

In this embodiment, each side of the cover 306 has an arm 342 that is adapted to lock the cover 306 in an open position. As illustrated, each arm 342 has a stem 344 and each side of the base 304 has a corresponding hole 346 adapted to receive a portion of the stem 344 when the cover 306 is positioned to a desired location relative to the cover 306. The hole 346 forms an obstruction to pivotal movement of the cover 306. In this embodiment, the portion of the stem 344 that is inserted within the hole 346 is tapered. When a pivotal force is applied to close the cover 306, the tapered surfaces of the stems 344 guide the stems 344 out of the holes 346, enabling the cover 306 to pivot freely.

In the illustrated embodiment, the cover 306 is adapted with a plurality of guide portions 348 that are adapted to provide additional support to the motherboard 302. The guide portions 348 are adapted to contact the top surface of the motherboard 302, in this embodiment, when the cover 306 is closed. The motherboard 302 is thereby supported between the guide portions 348 of the cover and the guide rails of the base 304 in all orientations of the protective assembly 300.

The techniques described above provide a removable protective assembly for protecting electronic components, such as memory modules, removably disposed within the protective assembly. In addition, the techniques provided above enable a motherboard to be installed and removed from the protective assembly without the use of tools and/or fasteners.

It will be understood that the foregoing description is of preferred exemplary embodiments of this invention, and that the invention is not limited to the specific forms shown. For example, a variety of rollbar configurations and protective cartridge configurations can be utilized depending on the particular application. These and other modifications may be made in the design and arrangement of the elements without departing from the scope of the invention as expressed in the appended claims.

What is claimed is:

1. A protective assembly for a component of an electronic device, comprising:

a base;

a circuit board secured to the base, the circuit board comprising:

a plurality of first electrical connectors, each first electrical connector being operable to receive at least one removable electronic component; and a second electrical connector operable to electrically couple the plurality of first electrical connectors to a corresponding electrical connector of the electronic device; and a protective member adapted to cooperate with the base to prevent engagement between the at least one removable electronic component and an external planar surface in all orientations of the protective assembly relative to the planar surface when the protective assembly is removed from the electronic device.

2. The assembly as recited in claim 1, wherein the protective member comprises a cover pivotally secured to the base.

3. The assembly as recited in claim 2, wherein the cover is operable to extend over the at least one removable electronic component.

4. The assembly as recited in claim 2, wherein the cover and the base are adapted to lock the cover in an open position.

5. The assembly as recited in claim 2, wherein the cover is adapted to urge the circuit board against the base when the protective cover is closed.

6. The assembly as recited in claim 1, wherein the at least one removable electronic component comprises at least one memory module.

7. The assembly as recited in claim 6, wherein the plurality of first electrical connectors are disposed at an angle relative to the circuit board.

8. The assembly as recited in claim 1, wherein the base comprises a tab adapted to prevent contact with the second electrical connector when the protective assembly is removed from the electronic device.

9. The assembly as recited in claim 1, wherein the circuit board and the base are adapted to enable the base to capture the circuit board, the base having a first tab to prevent displacement of the circuit board relative to the base in a first direction and a second tab to prevent displacement of the circuit board relative to the base in a second direction transverse to the first direction.

10. The assembly as recited in claim 9, wherein the first tab and the second tab are adapted to flex the circuit board as the circuit board is displaced in a first direction from a first position on the base towards a second position on the base.

11. The assembly as recited in claim 10, wherein the the first tab and the second tab are adapted to enable the circuit board to return to an un-flexed position when the circuit board is disposed in the second position.

12. The assembly as recited in claim 11, wherein the circuit board comprises a notch to enable the circuit board to be disposed on the base by aligning the notch with the first tab.

13. The system as recited in claim 1, wherein the circuit board and the base are adapted to enable the circuit board to be secured to the base without a movable fastener.

14. The system as recited in claim 1, wherein the circuit board and the base are adapted to secure the circuit board to the base in a tool-less engagement.

15. A method for protecting an electronic component utilized in a computer-based system, comprising:
disposing a circuit board at a first position on a base of a protective assembly operable to protect the electronic component from engagement with an external planar surface; and
securing the circuit board to the protective assembly by displacing the circuit board in a first direction along the base from the first position to a second position relative to the base, wherein the base flexes the circuit board as the circuit board is disposed in the first direction and the base enables the circuit board to return to an un-flexed condition when the circuit board is disposed in the second position, whereupon the base obstructs further displacement of the circuit board relative to the base.

16. The method as recited in claim 15, wherein disposing a circuit board at a first position on a guide rail comprises aligning a notch of the circuit board with an obstructing member of the base to enable the circuit board to be disposed on the guide rail in the first position.

17. The method as recited in claim 16, wherein securing the circuit board to the protective assembly by displacing the circuit board in a first direction along the base comprises disposing a portion of the circuit board intermediate a guide rail and a tab extending from the base.

18. The method as recited in claim 16, wherein the circuit board is removed from the protective assembly by flexing the circuit board over the second portion of the base to enable the circuit board to be displaced from the second position to the first position.

19. The method as recited in claim 16, further comprising: disposing the protective assembly within a chassis of the computer-based system.

20. The method as recited in claim 19, wherein disposing the protective assembly comprises connecting an electrical connector disposed on the first circuit board with a second electrical connector disposed within the chassis.

21. A method for assembling an apparatus, comprising:
providing a protective assembly for protecting a circuit board in a computer-based system, the protective component assembly comprising a guide member and a base;
pivoting the guide member to a first position relative to the base;
inserting the circuit board into the guide member when the guide member is pivoted to the first position; and
pivoting the guide member from the first position towards the base to dispose the circuit board against the base.

22. The method as recited in claim 21, comprising displacing the circuit board relative to the base to orient the circuit board with an obstruction operable to prevent displacement of the circuit board in a direction transverse to the base.

23. The method as recited in claim 22, comprising threading a threaded fastener into the base to secure the circuit board to the base when the circuit board is displaced relative to the base.

24. A protective housing for a plurality of memory modules of a server, comprising:
a base, comprising:
a support rail;
a first member displaced relative to the support rail, wherein the support rail and the first member are operable to support a circuit board at an angle relative to the base when the circuit board is disposed at a first position on the base; and
a second member operable to guide the circuit board onto the support rail as the circuit board is disposed from the first position to a second position on the base, wherein the first member blocks the circuit board from being removed transversely from the base, and the second member blocks the circuit board from being disposed laterally from the second position to the first position when the circuit board is disposed in the second position.

25. The protective housing as recited in claim 24, comprising the circuit board, the circuit board comprising:
a plurality of first electrical connectors, each first electrical connector being operable to receive at least one memory module; and
a second electrical connector operable to electrically couple the circuit board to a corresponding electrical connector of a server.

26. The protective housing as recited in claim 24, comprising a pivotable cover adapted to extend over the plurality of memory modules to protect the plurality of memory modules from engagement with a planar surface when the protective housing is removed from the server.

27. The protective housing as recited in claim 24, wherein the second member extends inward from a side of the base, and the circuit board comprises a notch adapted to provide clearance around the second member to enable the circuit board to be disposed on the support rail.

28. The protective housing as recited in claim 27, wherein the notch defines an edge of the circuit board and the second member comprises an angled portion operable to guide the edge of the circuit board towards the support rail.

29. The protective housing as recited in claim 27, wherein the second member comprises a flat portion oriented parallel to the support rail to capture the circuit board therebetween.

* * * * *